ATTENUATION CIRCUIT

Original Filed Feb. 18, 1957

Inventors:
Meritt L. Miller:
Harold J. Dalman,
by [signature]
Their Attorney.

United States Patent Office 2,987,678

Patented June 6, 1961

2,987,678

ATTENUATION CIRCUIT

Meritt L. Miller and Harold J. Dalman, Fort Wayne, Ind., assignors to General Electric Company, a corporation of New York Continuation of application Ser. No. 640,672, Feb. 18, 1957. This application Nov. 13, 1959, Ser. No. 852,901
3 Claims. (Cl. 330—109)

This invention relates to transmission circuits, and more particularly to attenuation circuits having improved band pass characteristics so as to provide substantially flat response to frequencies throughout an extended band except at the selected attenuated frequency. This application is a continuation of the copending application of Meritt L. Miller and Harold J. Dalman, Serial No. 640,672, filed February 18, 1957 for attenuation circuit, and now abandoned.

There are many transmission circuits where the attenuation of a particular frequency is desired with as little effect on the other frequencies as possible. While it has not been difficult to obtain substantially complete elimination of the selected frequency, previously used circuits have tended to have an attenuation effect which increased gradually up to the selected frequency and which therefore had a substantial effect on frequencies adjoining it. It is most desirable to provide an attenuation circuit wherein the attenuation effect at the selected frequency will remain unimpaired but almost no attenuation will occur in the frequency band on either side of the selected frequency.

It is therefore an object of this invention to provide an attenuation circuit which will have an improved band pass characteristic with a substantially flat response to all frequencies except the one selected frequency, at which the circuit will exhibit a sharp attenuation characteristic.

A further object of the invention is to provide an amplifier and a parallel T network in a regenerative feedback circuit which will provide considerably greater selectivity at the desired frequency than is normally obtained with a parallel T network.

In one aspect thereof, the invention provides an attenuation circuit which includes an amplifier. A parallel T network includes a pair of resistances in series, a pair of capacitances in series connected in parallel with the resistances, a third resistance connected between the junction of the pair of capacitances and the amplifier output terminal, and a third capacitance connected between the junction of the pair of resistances and the output terminal. The pairs of resistances and capacitances are connected at one end to the amplifier input terminal. With this connection, the other end of the pairs of resistances and capacitances is adapted to be connected to receive an input signal. Provided the amplifier has a low output impedance relative to the impedance of the parallel T network, the regenerative feedback circuit effect which is obtained by connecting the network to a point in the amplifier having a gain of no more than unity causes the arrangement to have considerably greater selectivity in attenuating a single frequency and in leaving the other frequencies substantially unaffected.

Figure 2:
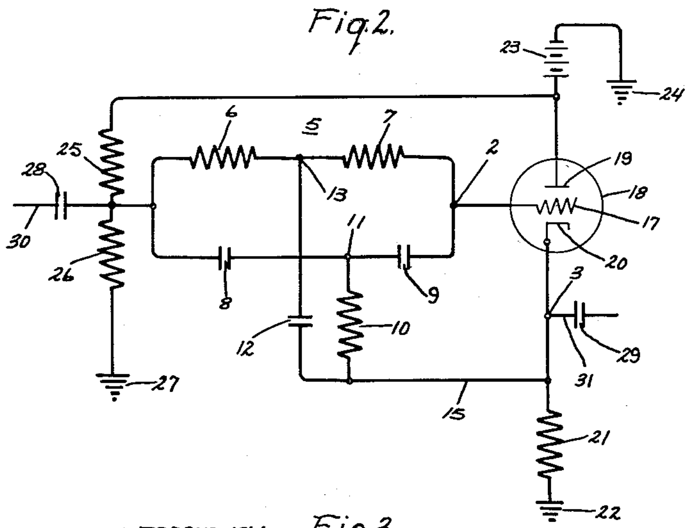
FIGURE 2 is a schematic circuit diagram of a preferred embodiment of the invention.

Referring now to the figures of the drawing, there is shown an amplifier 1 having an input terminal 2 and an output terminal 3; amplifier 1 may be conveniently grounded as shown at 4. Considerable discretion may be utilized in the selection of the particular amplifier; however, as will appear below, care must be taken in the selection of a feedback point in the amplifier to ensure that the gain at that point be no greater than unity otherwise the stability of the circuit is impaired. Also, the signal at the point must be less than 90° out of phase with the input signal to the amplifier to ensure the desired regenerative effect. The output impedance of amplifier 1 must be low relative to the impedance of the filter network which is to be described. Preferably, the proportion of amplifier output impedance to network impedance should not exceed about ten percent, although this figure should not be taken to represent a critical limitation.

A parallel T network, generally indicated at 5, is provided. As is customary, network 5 includes a pair of resistances 6 and 7 in series, and a pair of capacitances 8 and 9 which are in parallel with the resistances and in series with each other. A third resistance 10 is connected to a junction point 11 between the capacitances 8 and 9 and a third capacitance 12 is connected to a junction point 13 between the resistances 6 and 7. It will, of course, be understood that suitable selection of the resistances 6, 7 and 10 and of the capacitances 8, 9 and 12 determines the selection of the frequency which is to be attenuated, and the degree of symmetry of the band pass characteristics. A suitable input signal to be corrected is applied at point 14 at one end of the parallel pairs of impedances; the other end of the pairs of impedances is directly connected to the input terminal 2 of amplifier 1 so that the amplifier in effect receives the output of the filter network 5.

A regenerative feedback circuit is obtained by connecting the other ends of resistance 10 and capacitance 12 to a suitable point 32 in the amplifier through an appropriate conductor 15. The point must be one where the gain is unity or less (even if the amplifier, considered as a whole is high gain), and the phase must not be more than 90 degrees from the phase of the input signal in order to be sure of providing a true regenerative effect, i.e., increasing the amplification. At frequencies which are removed from the selected frequency, the regenerative circuit has the effect of tending to maintain the measured voltage across the network at a level substantially unimpaired by the normal attenuation function of this type of network. However, at the selected frequency, the filter network overcomes the regenerative effect to perform its normal attenuating function, that is, the network behaves in substantially the same manner as if its impedances 10 and 12 were grounded instead of being connected into the amplifier 1. Thus, at the selected frequency, filter network 5 will perform the desired attenuating function while at all other frequencies, including those relatively close to the selected frequency, the regenerative feedback effect will maintain the signal substantially unattenuated.

The response obtained with the connections of FIG-

Figure 3:
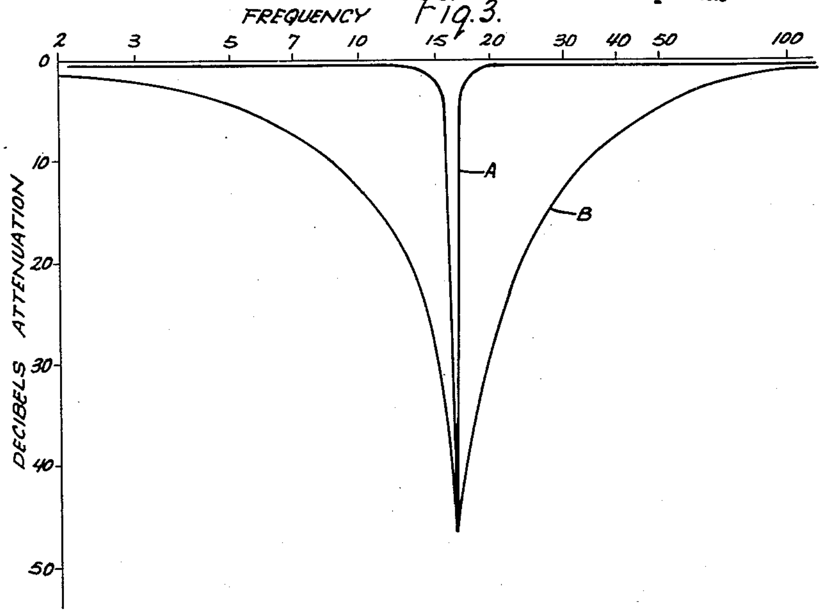
FIGURE 3 is a graph illustrating the operating characteristics of the circuit of the invention.

URE 1 is illustrated by curve A of FIGURE 3, while the response obtained by the normal parallel T connection, wherein impedances 12 and 10 are connected to ground, is indicated by curve B. These curves will be more fully discussed in connection with the specific embodiment of FIGURE 2.

Figure 1:
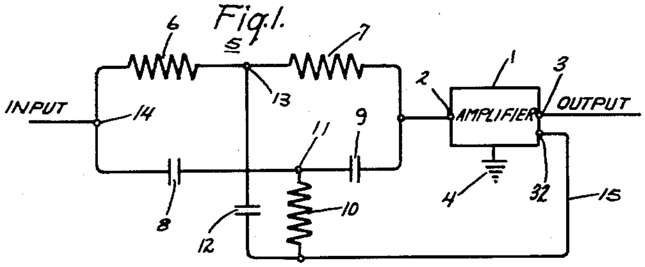
FIGURE 1 is a block diagram of the invention.

Referring now to FIGURE 2, it will be observed that it includes filter network 5; the same numerals are used for the parts of this network as in FIGURE 1. Network 5 is connected at point 2 to the grid 17 of a triode vacuum tube 18 so that the output signal from the network 5 is impressed across the grid 17. Tube 18 also includes a plate 19 and a cathode 20 with a load resistor 21 connected between the cathode and ground as indicated at 22. This type of circuit, including tube 18 and resistor 21, is commonly called a cathode follower circuit and is characterized both by the fact that the gain can never exceed unity and that for a given potential the cathode 20 will follow grid 17 so as to maintain a predetermined potential between them.

The necessary direct current plate potential is impressed on plate 19 by connecting it to a source 23 of direct current power which in turn is connected to ground as shown at 24. In order to raise the steady state current in the circuitry of FIGURE 2 to a high enough value to facilitate operation, a resistance 25 may be connected between the plate 19 and the input point 14 of network 5, as shown, and a second resistance 26 which is connected to ground as shown at 27, may be provided to complete this connection. In order to preclude the direct current plate supply from being impressed outside the filtering circuit constituting the invention, a pair of blocking capacitors 28 and 29 may be provided. Capacitor 28 is provided in line 30 through which the input signal passes to point 14, and capacitor 29 is provided in the output line 31 through which the output signal from the cathode follower passes.

As stated before, network 5 receives an input signal to be filtered at point 14, and from point 2 has its output impressed across grid 17. The regenerative feedback circuit broadly described in connection with FIGURE 1 is achieved by connecting impedances 10 and 12 by a line 15 to the output line 31. This is feasible, in this particular case, because the gain, even at the output terminal, is less than unity with the particular circuit described. Also, the phase is necessarily the same as that of the input signal in this case, which represents the optimum phase relationship for regenerative purposes. The connection described feeds the output signal back into the network so as to oppose attenuation of the signal until the selected frequency is reached.

A network 5 having the following resistances and capacitances respectively was tested in a circuit of the type shown in FIGURE 2:

| | | |
|---|---|---|
| Resistance 6 | ohms | 10,000 |
| Resistance 7 | do | 100,000 |
| Resistance 10 | do | 10,000 |
| Cacapitance 8 | microfarads | 1.0 |
| Capacitance 9 | do | 0.1 |
| Capacitance 12 | do | 1.0 |

The vacuum tube was a simple triode of the 5814 type, and resistor 21 was provided with a value of 15,000 ohms. The output impedance of the cathode follower circuit was 200 ohms, or 2% of the network impedance. With an ordinary parallel T network connection having the above resistance and capacitance values, it was found that the attenuation in decibels with respect to the frequency varied as shown by curve B of FIGURE 3. This curve shows that at an entire octave away from the selected frequency, the filter network has an attenuation of ten decibels and that at half an octave the attenuation has risen to 17 decibels. This degree of attenuation so far away from the selected frequency represents a serious limitation on the use of a parallel T filter network. However, when the apparatus was connected as described in FIGURE 2, a curve as shown by A in FIGURE 3 was obtained. The attenuation at a full octave from the selected frequency had been cut to less than half a decibel (which represents only about 4%) and at half an octave away the loss is still less than one decibel, which represents less than 9 percent. It is thus seen that the regenerative feedback action achieved by the circuitry of the invention provides a material advantage in improving the band pass characteristics of the parallel T filter network without any material effect on the attenuation at the selected frequency.

While the invention has been explained by describing a particular embodiment thereof, it will be apparent, particularly in the light of FIGURE 1, that improvements and modifications may be made without departing from the scope of the invention as defined in the appended claims.

What we claim as new and desire to secure by Letters Patent of the United States is:

1. An attenuation circuit comprising an amplifier having an input terminal and a signal output circuit, and a parallel T network including a pair of resistances in series, a pair of capacitances in series connected in parallel with said resistances, a third resistance having one end connected to the junction of said pair of capacitances and a third capacitance having one end connected to the junction of said pair of resistances, said third resistance and capacitance having their other ends connected solely to a point on said amplifier output circuit for feeding back at least a portion of the output signal of said amplifier to said T network, said pair of resistances and said pair of capacitances being connected at one end to said amplifier input terminal and being adapted to be connected at their other end to receive an input signal, said amplifier having a low output impedance relative to the impedance of said network, the gain at said point on said amplifier output circuit being no more than unity and the phase at said point being less than 90° removed from the phase at said input terminal, said gain and phase being continuously maintained during operation of the circuit and said circuit having an attenuation at one-half octave from the selected frequency of no more than one decibel, said attenuation at the selected frequency tending to approach infinity.

2. An attenuation circuit comprising an amplifier having an input terminal and a signal output circuit, and a parallel T network including a pair of resistances in series, a pair of capacitances in series connected in parallel with said resistance, a third resistance having one end connected to the junction of said pair of capacitances and a third capacitance having one end connected to the junction of said pair of resistances, said third resistance and capacitance having their other ends connected solely to a point on said amplifier output circuit for feeding back at least a portion of the output signal of said amplifier to said T network, said pair of resistances and said pair of capacitances being connected at one end to said amplifier input terminal and being adapted to be connected at their other end to receive an input signal, said amplifier having a low output impedance relative to the impedance of said network, the gain at said point on said amplifier output circuit being no more than unity and the phases at said point and at said input terminal being substantially the same, said gain and phase being continuously maintained during operation of the circuit and said circuit having an attenuation at one-half octave from the selected frequency of no more than one decibel, said attenuation at the selected frequency tending to approach infinity.

3. An attenuation circuit comprising a cathode follower circuit including a vacuum tube having at least an anode, a cathode and a grid, said cathode follower circuit further including a load resistance connected between said cathode and ground, and a parallel T network including a pair of resistances in series, a pair of capacitances in series connected in parallel with said resistances, a third network resistance connected between the junction of said pair of capacitances and the junction of said load resistance with said cathode, a third capacitance connected between the junction of said pair of resistances and the junction of said load resistance with said cathode, said pair of resistances and said pair of capacitances being connected at one end to said grid and being adapted to be connected at their other end to receive an input signal, said amplifier having a low output impedance relative to the impedance of said network and said circuit having an attenuation at one-half octave from the selected frequency of no more than one decibel, said attenuation at the selected frequency tending to approach infinity.

References Cited in the file of this patent

UNITED STATES PATENTS

| | | |
|---|---|---|
| 2,407,084 | Lavender | Sept. 3, 1946 |
| 2,459,046 | Rieke | Jan. 11, 1949 |